(12) United States Patent
Il'ichev et al.

(10) Patent No.: US 7,042,005 B2
(45) Date of Patent: May 9, 2006

(54) EXTRA-SUBSTRATE CONTROL SYSTEM

(75) Inventors: Evgeni Il'ichev, Jena (DE); Miles F. H. Steininger, West Vancouver (CA)

(73) Assignee: D-Wave Systems, Inc., Burnaby (CA)

( * ) Notice: Subject to any disclaimer, the term of this patent is extended or adjusted under 35 U.S.C. 154(b) by 0 days.

(21) Appl. No.: 10/746,992

(22) Filed: Dec. 24, 2003

(65) Prior Publication Data

US 2004/0140537 A1    Jul. 22, 2004

Related U.S. Application Data

(62) Division of application No. 10/134,665, filed on Apr. 26, 2002, now Pat. No. 6,911,664.

(60) Provisional application No. 60/372,985, filed on Apr. 15, 2002.

(51) Int. Cl.
*H01L 29/06* (2006.01)

(52) U.S. Cl. .......................... 257/31; 264/663; 365/160

(58) Field of Classification Search ............ 257/31–34, 257/36–39, 663; 505/191, 239; 365/160–162
See application file for complete search history.

(56) References Cited

U.S. PATENT DOCUMENTS

| | | | |
|---|---|---|---|
| 3,573,759 | A | 4/1971 | Silver et al. |
| 5,323,344 | A | 6/1994 | Katayama et al. |
| 5,326,986 | A | 7/1994 | Miller et al. |
| 6,317,766 | B1 | 11/2001 | Grover |
| 6,360,112 | B1 | 3/2002 | Mizuno et al. |
| 6,495,854 | B1 | 12/2002 | Newns et al. |
| 6,803,599 | B1 | 10/2004 | Amin et al. |
| 2001/0020701 | A1 | 9/2001 | Zagoskin |
| 2003/0111661 | A1 | 6/2003 | Tzalenchuk et al. |

FOREIGN PATENT DOCUMENTS

| | | |
|---|---|---|
| DE | 195 11 172 A1 | 10/1996 |
| EP | 0916961 A2 | 5/1999 |
| WO | WO 96/12305 | 4/1996 |
| WO | WO 2003/090161 A2 | 10/2003 |
| WO | WO 2003/090161 A3 | 2/2005 |

OTHER PUBLICATIONS

U.S. Appl. No. 60/349,663, filed Jan. 15, 2002, Zagoskin et al.

A. Barenco et al., "Elementary Gates for Quantum Computation," *Physical Review A* 52:3457-3467 (1995).

(Continued)

*Primary Examiner*—Sara Crane
(74) *Attorney, Agent, or Firm*—Jones Day; Brett Lovejoy

(57) ABSTRACT

The present invention involves a quantum computing apparatus that includes a substrate attached to which is a flux shield upon which is at least one element of circuitry. The flux shield has an aperture. Inside the aperture is a superconducting structure. The superconducting structure and the circuitry interact so that a change in a state of the superconducting structure can be detected by the circuitry. The present invention provides a method for initializing and measuring the state of a superconducting structure by adjusting and measuring the current in an element of circuitry coupled to the structure by a flux shield. The present invention provides a mechanism for coupling qubits. In embodiments of the present invention, qubits are selectively coupled by a coupling circuit that can be on a second substrate. The coupling of the qubit to the coupling circuit is enhanced by the presence of a flux shield.

10 Claims, 8 Drawing Sheets

OTHER PUBLICATIONS

A. Barone, T. Hakioğlu, and I.O. Kulik, "Quantum Computation with Aharonov-Bohm Qubits," www.arXiv.org preprint: cond-mat/0203038 v1(Mar. 2, 2002).

S.L. Braunstein and H-K. Lo (eds.), *Scalable Quantum Computers*, Wiley-VCH Verlag GmbH, Berlin (2001) pp. 273-284; 285-304; 305-324.

D. Deutsch, "Quantum Theory, the Church-Turing Principle and the Universal Quantum Computer," *Proc. of the Roy. Soc. of London A 400*:97-117 (1985).

D. DiVincenzo, "The Physical Implementation of Quantum Computation," published www.ArXiv.org preprint: quant-ph/0002077 (Apr. 13, 2000).

R. P. Feynman, "Simulating Physics with Computers," *Int. J. Theor. Phys. 21*:467-488 (1982).

J.R. Friedman, V. Patel, W. Chen, S.K. Tolpygo, and J.E. Lukens, "Quantum superposition of distinct macroscopic states," *Nature*, 406:43-46 (2000).

L. Grover, "A Fast Quantum Mechanical Algorithm for Database Search," *Proc. 28th STOC*, 212-219 (1996).

E. Il'ichev, V. Zakosarenko, R.P.J. IJsselsteijn, V. Schultze, H.G. Meyer, H.E. Hoenig, H. Hilgenkamp, and J. Mannhart, "Nonsinusoidal current-phase relationship of grain boundary Josephson junctions in high-$T_c$ superconductors," *Phys. Rev. Lett. 81*:894-897 (1998).

Il'ichev et al., "Radio-frequency Based Monitoring of Small Supercurrents," *Review of Scientific Instruments 72*(3):1882-1887, (2001).

E. Il'ichev, M. Grajcar, R. Hlubina, R.P.J. IJsselsteijn, H.E. Hoenig, H.-G. Meyer, A. Golubov, M.H.S. Amin, A.M. Zagoskin, A.N. Omelyanchouk, and M.Yu. Kupriyanov, "Degenerate Ground State in a Mesoscopic $YBa_2Cu_3O_{7-x}$ Grain Boundary Josephson Junction," *Phys. Rev. Lett.*, 86:5369-5372 (Mar. 2001).

P. Joyez et al., "Observation of Parity-Induced Suppression of Josephson Tunneling in the Superconducting Single Electron Transistor," *Physical Review Letters*, 72(15):2458-2461, (1994) (with reprint of Fig. 1).

M.B. Ketchen, "Integrated Thin-Film dc SQUID Sensors," *IEEE Trans. on Magnetic* 23(2):1650-1657 (1987).

I.O. Kulik, T. Hakioğlu, and A. Barone, "Quantum Computational Gates with Radiation Free Couplings," www.arXiv.org preprint: cond-mat/0203313 v1 (Mar. 14, 2002).

Y. Makhlin, G. Schön, and A. Shnirman, "Quantum-State Engineering with Josephson-Junction Devices," *Reviews of Modern Physics 73*:357-400 (Apr. 2001).

J.E. Mooij, T.P. Orlando, L. Levitov, L. Tian, C.H. van der Wal, and S. Lloyd, "Josephson persistent-current qubit," *Science 285*:1036-1039 (1999).

Y. Nakamura, Yu. A. Pashkin, and J.S. Tsai, "Coherent control of macroscopic quantum states in a single-Cooper-pair box," *Nature 398*: 786-788 (1999).

T.P. Orlando, J.E. Mooij, L. Tian, C.H. van der Wal, L.S. Levitov, S. Lloyd, and J.J. Mazo, "Superconducting Persistent Current Qubit," *Phys. Rev. B* 60:15398-15413 (1999).

T.P. Orlando, L. Tian, D.S. Crankshaw, S. Lloyd, C.H. van der Wal, J.E. Mooij, and F. Wilhelm, "Engineering the Quantum Measurement Process For The Persistent Current Qubit," *Physica C 368*:294-299 (Mar. 2002).

R. Rifkin and B.S. Deaver, "Current-Phase relation and phase-dependent conductance of superconducting point contacts from rf impedance measurements," *Phys. Rev. B 13*:3894-3901 (1976).

V.V. Schmidt, *The Physics of Superconductors*, P. Müller and A.V. Ustinov (Eds.), Springer, 1997, chapter 4.

A. Shnirman, and G. Schön, "Quantum measurements performed with a single-electron transistor," *Phys. Rev. B* 57(24):15400-15407 (1998).

R. Stolz, L. Fritzsch and H.-G. Meyer, "LTS SQUID sensor with a new configuration," *Supercond. Sci. Technol. 12*: 806-808 (1999).

H. Tanaka, Y. Sekine, S. Saito and H. Takayanagi, "DC-SQUID Readout Readout For Qubit," *Physica C*, 368:300-304 (Mar. 2002).

C.H. van der Wal, A.C.J. ter Haar, F.K. Wilhelm, R.N. Schouten, C.J.P.M. Harmans, T.P. Orlando, S. Lloyd, J.E. Mooij, "Quantum Superposition of Macroscopic Persistent-Current States," *Science*, 290:773-777 (2000).

Berggren, K.K., et al., "An Integrated Superconductive Device Technology for Qubit Control," *Proceedings of the 1st International Conference on Experimental Implementation of Quantum Computation*, front page, copyright page, pp. 121-126 (2001).

Zhang, Y., et al., "Substrate resonator for HTS rf SQUID operation," *Physica C 372-376*:282-286 (2002).

EXTRA-SUBSTRATE CONTROL SYSTEM

CROSS-REFERENCE TO RELATED APPLICATIONS

This application is a division of Ser. No. 10/134,665, filed Apr. 26, 2002, now U.S. Pat. No. 6,911,664, which claims priority to provisional U.S. application Ser. No. 60/372,958, filed on Apr. 15, 2002, entitled "Extra Substrate Control System", which is incorporated herein by reference.

This application is also related to U.S. patent application Ser. No. 09/452,749 entitled "Permanent Readout Superconducting Qubit" filed Dec. 1, 1999; US. Pat. No. 6,803,599; U.S. Pat. No. 6,614,047; U.S. patent application Ser. No. 60/341,794, entitled "Characterization And Measurement of Superconducting Structures" filed Dec. 18, 2001; and U.S. patent application Ser. No. 60/349,663, entitled "Two Junction Phase Qubit" filed Jan. 15, 2002, each of which is incorporated herein by reference in its entirety.

FIELD OF THE INVENTION

This invention relates to quantum computing devices, and more specifically to initializing, controlling, coupling, and measuring the state of structures that could be used as qubits in quantum computing devices.

BACKGROUND

Research in the field of quantum computing began in 1982 when Richard Feynman introduced the concept of a "quantum simulator." See R. P. Feynman, "Simulating Physics with Computers", *Int. J. Theor. Phys.,* 21:467–488 (1982). Soon it was determined that a quantum system could be used to yield a potentially exponential time saving in certain types of intensive computations. See D. Deutsch, "Quantum Theory, the Church-Turing Principle and the Universal Quantum Computer", *Proc. of the Roy. Soc. of London* A400:97–117 (1985). Since then, research has progressed to include significant software and hardware advances. As the speed of classical computers approaches a projected upper bound due to the natural limits of miniaturization of integrated circuits, so interest in quantum computers has intensified. Indeed many algorithms to run on quantum computers have been written, two notable examples being the Shor and Grover algorithms. See P. Shor, "Polynomial-time Algorithms for Prime Factorization and Discrete Logarithms on a Quantum Computer", *SIAM J. of Comput.,* 26(5): 1484–1509 (1997), and U.S. Pat. No. 6,317,766 entitled "Fast Quantum Mechanical Algorithms"; and L. Grover, "A Fast Quantum Mechanical Algorithm for Database Search", *Proc. 28th STOC,* 212–219 (1996). Nevertheless, sizeable obstacles remain to the development of large-scale quantum computing devices that are both practical and capable of out-performing currently available classical computers. See, for example, "Quantum Dreams", *The Economist*, Mar. 10, 2001, pp. 81–82.

In fact, the field of quantum computing remained theoretical until the late 1990's when several hardware proposals were tested. Of these proposals, the most scalable physical systems are those that are superconducting structures. Superconducting material is material that has zero electrical resistance below critical levels of current, magnetic field and temperature. Josephson junctions are examples of such structures that have been of special interest because their observable properties are macroscopic manifestations of underlying quantum mechanical principles.

A preferred physical realization of a quantum computer is based on quantum bits, or "qubits." Generally speaking, a qubit is a well-defined physical structure that has a plurality of quantum states, that can be isolated from its environment and that can evolve in a quantum mechanical fashion. A survey of the current physical systems from which qubits could be formed can be found in: S. L. Braunstein and H. K. Lo (eds.), *Scalable Quantum Computers*, Wiley-VCH Verlag GmbH, Berlin (2001), incorporated herein by reference. The information storage and processing capacity of a quantum computer can potentially exceed the capacity of the most powerful classical computers because, according to some views, a quantum computer can be considered to be a parallel machine. In such a view, capacity is considered to be exponential in physical size, nominally measured by the number of qubits, as opposed to the more familiar polynomial relationship between capacity and number of bits for a classical computer. This view of capacity means that as quantum computers grow in size they are destined to substantially outperform the most powerful classical computers that could ever be contemplated.

A series of nominal capabilities are held to be necessary conditions for a physical system to behave as a qubit and for a series of qubits to become a quantum computer. See D. DiVincenzo in *Scalable Quantum Computers*, S. L. Braunstein and H. K. Lo (eds.), chapter 1, Wiley-VCH Verlag GmbH, Berlin (2001), also published as Los Alamos National Laboratory preprint "quant-ph/0002077" (2000), incorporated herein by reference. These requirements include the need for the system to be scalable, i.e., the ability of the system to combine a reasonable number of qubits. Associated with scalability is the need to eliminate decoherence in a qubit. Also required for a qubit to be useful in quantum computing, is the ability to perform operations that initialize, control and couple qubits. Control of a qubit includes performing single qubit operations as well as operations on two or more qubits. Coupling is an operation performed on two or more qubits. This set of operations also needs to be a universal set, i.e., one which permits quantum computation. Fortunately, many sets of gates are universal, see A. Barenco et al., "Elementary Quantum Gates for Quantum Computation", *Physical Review A* 52:3457 (1995), incorporated herein by reference. Finally, it is necessary to be able to measure the state of a qubit in order to perform computing operations.

There are two principal means to realize qubits, corresponding to the limits of well defined charge (charge qubit) or phase (phase qubit). Phase and charge are related variables that, according to basic quantum principles, are canonical conjugates of one another. The division of the two classes of device is outlined in Y. Makhlin, G. Schön, and A. Shnirman, "Quantum-State Engineering with Josephson-Junction Devices", *Reviews of Modern Physics*, 73:357 (2001), incorporated herein by reference. Materials that exhibit superconducting properties are attractive candidates for quantum computing applications, since the quantum behavior of the Bose condensates (Cooper pairs) at Josephson junctions have macroscopically observable consequences. Indeed, recently, several designs of a superconducting qubit have been proposed and tested; see Y. Nakamura et al., *Nature*, 398:786 (1999); J. R. Friedman et al., *Nature*, 406:43 (2000); C. H. van der Wal et al., *Science*, 290:773 (2000), all of which are incorporated herein by reference. These qubits have not yet been coupled and controlled in a scalable manner.

The preferred type of superconducting material used depends on the nature of the qubit. Very broadly, the materials are often divided into metals and oxides. However, the ability to deposit metals and oxides (that are not oxides of the deposited metal) on the same chip requires expensive facilities. In general, although it has been found easy to create a layer of metal oxide on the surface of the metal, the metal, it has been difficult to layer copper oxide superconductors in conjunction with other superconducting metals. Further, the conditions, such as extremes of low or high temperature, needed to optimize one process may not be amenable to another. This is a problem because certain types of qubits often require particular materials whereas the corresponding control systems require other types. Thus, implementing qubits is non-trivial.

Furthermore, the nature of qubits is such that their quantum mechanical properties are easily affected by interactions with other systems. Quantum computing requires that qubits be isolated so that the state of a qubit can coherently evolve. However, to permit universal quantum computing, some system with control over, i.e., interaction with, the qubit is needed so that the state of the qubit can be measured, as well as initialized. This apparently contradictory situation arises directly from the quantum behavior of qubits and presents numerous challenges for initialization, control, coupling and measurement of qubits. Accordingly, now that scalable quantum computing is becoming less of a theoretical dream and more of a physical reality, ways of devising and implementing solutions to the hardest technical challenges are being investigated. In particular, systems in which qubits can be controlled and measured in ways that do not perturb their internal quantum states are being sought. The implementation of multiple qubits in a single device, and in a controllable manner, so that qubits may couple with one another thereby permitting classical logic operations to be performed, is central to the goal of building a quantum computer. Hitherto, previous methods of coupling model qubits in quantum computing devices have been unwieldy, being based on optics (entanglement of photons) or nuclear magnetic resonance (utilizing spin states of atoms and molecules).

Recently inductive coupling between phase qubits has been described in: T. P. Orlando, J. E. Mooij, L. Tian, C. H. van der Wal, L. S. Levitov, S. Lloyd, and J. J. Mazo, "Superconducting Persistent Current Qubit", *Phys. Rev. B* 60:15398 (1999), and Y. Makhlin, G. Schön, and A. Shnirman, "Quantum-State Engineering with Josephson-Junction Devices", *Reviews of Modern Physics* 73:357 (2001), at page 369, each of which is incorporated herein by reference. These qubits have also not yet been coupled and controlled in a scalable manner, however.

Inductive coupling with qubits for the purpose of readout has also been investigated. See, e.g., T. P. Orlando, Lin Tian, D. S. Crankshaw, S. Lloyd, C. H. van der Wal, J. E. Mooij, and F. Wilhelm, "Engineering the Quantum Measurement Process For The Persistent Current Qubit" *Physica C* 368: 294–299 (2002), and H. Tanaka, Y. Sekine, S. Saito and H. Takayanagi, "DC-SQUID Readout For Qubit," *Physica C* 368:300–304 (2002), each of which is incorporated herein by reference in its entirety. Measurement and characterization of these quantum devices relied on a DC SQUID (Superconducting QUantum Interference Device). The experiments of Orlando et al., couple a DC-SQUID inductively to a flux qubit, where the qubit includes a superconducting loop and three Josephson junctions. Both the DC-SQUID and flux qubit are fabricated on the same substrate. The use of such a SQUID for testing and characterization may have drawbacks, including decohering the system through a strong back action, or the necessity of taking many measurements. Inference from data acquired in this manner requires a large number of measurements from which the device characteristics can be statistically inferred and data takes months to collect.

Therefore, a more immediate and unintrusive method for measurement and characterization of qubits is needed, and one that permits scalable coupling between qubits and other circuitry.

SUMMARY

The present invention provides a mechanism for coupling qubits.

The present invention generally involves a quantum computing apparatus that includes: a first substrate, attached to which is one or more layers of material, at least one of which is a superconducting material; a second substrate, deposited on which is a flux shield and on the flux shield is at least one element of circuitry. The superconducting material and the second substrate are separated by a mean distance that is small enough to permit coupling between the element of circuitry and the superconducting material.

The present invention also involves an extra-substrate control system that includes: a first substrate, attached to which is at least one superconducting structure; and a second substrate, connected to which is at least one element of circuitry. The superconducting structure and the circuitry interact, so that a change in a state of the superconducting structure can be detected by the circuitry.

DETAILED DESCRIPTION

Figure 1A:
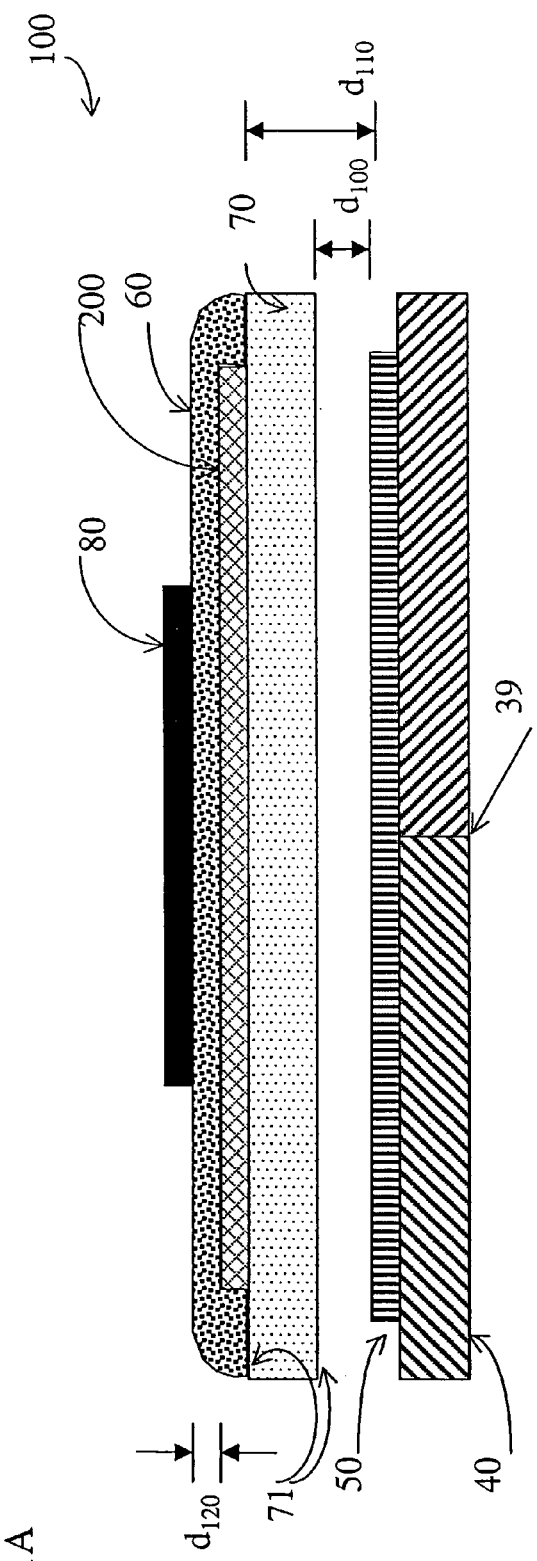
FIGS. 1A and 1B display two embodiments of the present invention in which superconducting material on a first substrate is coupled to circuitry on a second substrate.

When a high degree of isolation and robustness is required for the interaction of some structures, for example for quantum computing structures, embodiments of the present invention find application. Specifically, a need exists for controlling qubits to perform quantum computing. The present invention allows one structure, say a qubit, to interact with another structure, say a measurement circuit, where each may be formed from different materials, and by different processes, and reside on different substrates. Other aspects of the present invention relate to the need to have initialization, control, coupling and measurement circuitry for a given qubit or plurality of qubits. The present invention provides a flexible, inexpensive and scalable means to accomplish this.

In general, an extra substrate control system comprises a first substrate on which one or more superconducting structures, for example qubits, are placed such that the superconducting structures interact with a control system on a second substrate. An embodiment of the present invention includes the use of a flux focuser that permits the selective coupling of a single superconducting structure such as a qubit from a plurality of superconducting structures without coupling to other superconducting structures of the plurality. Accordingly, the present invention permits various circuitries to interact with a superconducting structure in a selectable manner.

An embodiment of the present invention includes a substrate with a superconducting structure on it, a second substrate with circuitry on it, and a mechanism for controllably coupling the circuitry to the superconducting structure. The superconducting structure can be a quantum computing structure such as a qubit, an array of qubits, or a quantum register comprised of qubits and associated circuitry. The present invention is generally applicable to phase qubits and charge qubits. In the case where the superconducting structure is a qubit, the circuitry often is used for initialization, control, coupling, and measurement. The circuitry can be made from normal, semi- or super-conducting material. The mechanism for coupling the superconducting structure to the circuitry includes inductive coupling and capacitive coupling. For example, the circuitry can have a loop that shares a mutual inductance with the superconducting structure. Control of this coupling mechanism may involve additional structures. In a Josephson junction, for example, quantum phase usually manifests itself as a magnetic moment which may be inductively coupled to other structures.

As is understood by one skilled in the art, a Josephson junction typically comprises two superconducting materials separated by a weak link, such as a thin layer of insulating material. A Josephson junction holds many attractions for researchers because the relation between the current through the junction and the phase difference in the two superconducting materials is readily characterized. This relation, which constitutes one of the so-called Josephson relations, can be generalized to a broad class of structures called "weak links" that are found in superconducting material. Examples of weak links and a mathematical treatment of the Josephson relations can be found in: V. V. Schmidt, *The Physics of Superconductors*, P. Müller and A. V. Ustinov Eds., Springer, 1997, chapter 4, which is incorporated herein by reference in its entirety. Certain Josephson junctions that exhibit time reversal symmetry breaking are well-suited for quantum computing because of the existence of doubly degenerate ground states of persistent current. The states are degenerate but distinguishable through the existence of magnetic flux found in either up or down directions corresponding to the persistent current states. These currents can exist in either a system of junctions, see Mooij et al., *Science*, 285:1036 (1999), or as recently observed, at a single Josephson junction which is said to be bistable (sometimes referred to as a "BJJ"), see Il'ichev et al., *Phys. Rev. Lett.*, 86:5369 (2001), both of which are incorporated herein by reference. Such junctions behave analogously to a simple 2-level quantum mechanical model system but can be practically manipulated because they may comprise as many as about $10^9$ electrons in a particular state. In preferred embodiments of the present invention, qubits are comprised of 2-level quantum systems with a double-well potential, for example systems made from Josephson junctions.

In accordance with an aspect of the present invention, a structure involving a plurality of substrates and respective structures is presented. It is assumed throughout, that where necessary, qubits and other superconducting elements are kept at temperatures substantially below their superconducting transition temperatures, utilizing methods and apparatus that would be familiar to one skilled in the art. In particular, temperatures much lower than 1 K, even as low as 10 mK (1 mK=$10^{-3}$ Kelvin), may be desired and may be achieved with the use of a $^3$He/$^4$He dilution refrigerator.

In FIG. 1A an embodiment 100 is shown with a first substrate 40 positioned adjacent to, and substantially parallel to, a second substrate 70. Herein, when one layer is described as being "on", "adjacent to" or "connected to" another layer, it is understood that a third layer may be interposed between the two layers. Except where it is specifically indicated that two layers are in contact, it is not to be assumed that two layers are in fact touching one another.

Both first substrate 40 and second substrate 70 have patterned material, i.e., material deposited in a pattern, on at least one surface. The patterned materials include a superconducting material layer 50, on the first substrate 40, and circuitry 80 on the second substrate 70. The patterned materials preferably also include a superconducting material layer 200, on the second substrate, that functions generally as a flux shield, and may function more specifically as a flux focuser. Layer 200 may also be comprised of a composite of non-superconducting materials such as non-superconducting metals. The patterned materials can further include insulating layers 60, for example to separate layer 200 from circuitry 80 or layer 200 from first substrate 40 (not shown).

The structure 100 allows for variation of the physical dimensions of the structure and the properties of components. For example, the substrates can be single or bicrystal. In FIG. 1A, the first substrate 40, is depicted as being a bicrystal because a grain boundary 39 is indicated. First substrate 40 has material 50 patterned on it. Material 50 is a superconducting structure. For example, in preferred embodiments, it is a superconducting qubit. The second substrate 70 and superconducting structure 50 are separated by a mean, nearest edge to nearest edge, distance $d_{100}$. Alternatively, material 50 may be covered with an insulator (not shown), the outer edge of which is then the reference for measuring distance $d_{100}$. The superconducting structure 50 is separated from superconducting material 200 by a mean distance $d_{110}$. Layer 200 is separated from circuitry 80 by a mean distance $d_{120}$. In other embodiments, the superconducting material 50 can be in contact with second structure 70 so that $d_{100}$ can be zero. The other separation distances depend on the embodiment of the invention in question. Layer 200 enables coupling between superconducting material 50 on the first substrate and circuitry 80 on the second substrate.

The material 80 can comprise normal, semi- or superconducting circuitry, or combinations thereof, depending on the application. Material 80 can also comprise one or more dielectrics, for example as found in a capacitor. An example of circuitry 80 is a measurement circuit sensitive to small magnetic fields such as a Superconducting Quantum Interference Device (SQUID) made from superconducting material or a circuit with an inductive coupling and resonance behavior. SQUIDs are well known in the art and have application where magnetic fields need to be determined with great sensitivity. Embodiments of circuitry built from material 80 include layers of, for example, superconducting material that are about 200 nm (1 nm=$10^{-9}$ m) thick. It is to be assumed that superconducting circuitry of the present invention may comprise one or more Josephson junctions and may comprise additionally or in the alternative, one or more dirty Josephson junctions.

Figure 1B:
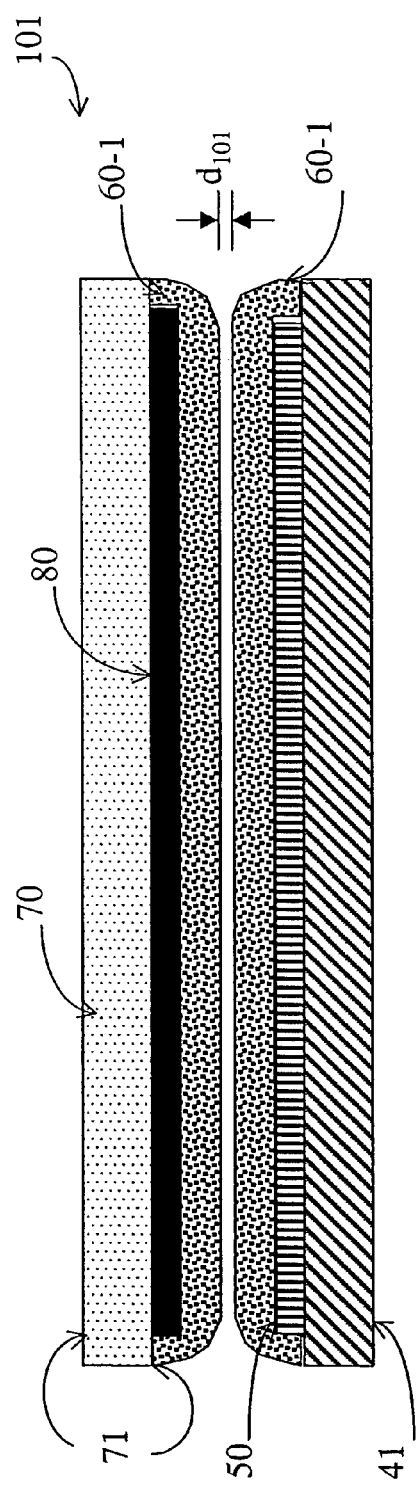

Additional variations of the embodiment 100 are possible. One such variation is shown in FIG. 1B, labeled 101, in which layer 200 has been removed. A preferred embodiment of 101 has a layer 200 in between layer 80 and substrate 70. Where layer 200 is absent, coupling between superconducting layer 50 and material 80 is provided by interactions such as capacitive coupling. Embodiment 101 has many of the same elements as embodiment 100, including some optional elements such as an insulating layer 60. One feature that may be present in both embodiments is the presence of optional polished surfaces 71 on one of the substrates, for example 70. In place of polished surfaces, substrates that are naturally transparent can also be used. An example of a naturally transparent substrate is a strontium-titanate substrate, sometimes used in manufacturing qubits, available from KagakuGijutsu-sha of Tokyo, Japan. Note that for embodiment 101, the orientation of 70 and 60 with respect to 40 has been inverted. Further, in this example, a single crystal substrate 41 is present in place of substrate 40.

Figure 2:
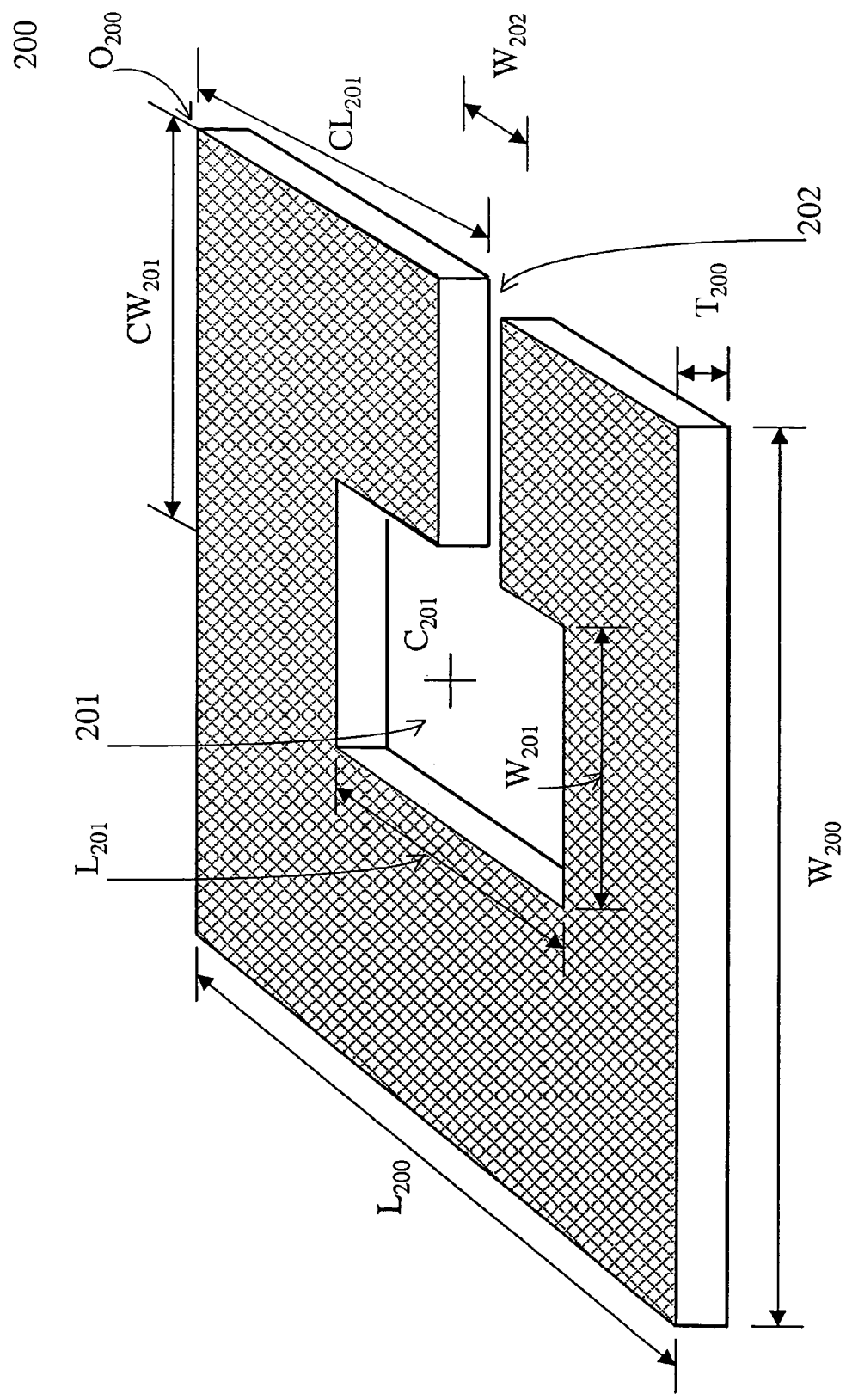
FIG. 2 shows a schematic view of a flux shield, illustrating aspects of the flux shield including features that enable its application as a flux focuser.

In accordance with an aspect of the present invention, the superconducting material layer 200, shown in FIG. 1A, is detailed in FIG. 2. Layer 200 is generally a flux shield and may specifically be a flux focuser. Layer 200 enables the coupling between superconducting material 50 on first substrate 40 and circuitry 80 on second substrate 70. The material used for 200 is selected to exclude magnetic and, optionally, electric fields. Such fields are commonly and collectively referred to as flux. Preferably, a material that is used to form layer 200 is a superconducting material. For example, so called, type I superconductors such as niobium (Nb), aluminum (Al), or lead (Pb) are capable of expelling flux and therefore may shield adjacent materials from flux. The thickness of layer 200 is $T_{200}$ as shown which, for a superconductor, should exceed several times the London penetration depth of the material used. For an embodiment fabricated from Nb, $T_{200}$ is preferably approximately 250 nm. With respect to an arbitrary reference point $O_{200}$, on the edge of layer 200, the layer has a length $L_{200}$ and a width $W_{200}$ wherein layer 200, has a length $L_{200}$ that is greater than or equal to a width $W_{200}$, i.e., $L_{200} \geq W_{200}$. The area and shape of layer 200 are selected to shield a region of a substrate that is close to or in contact with layer 200. The area of the shielded region varies according to the particular embodiment, i.e., the desired strength and direction of flux, and can be determined via methods well known in the field of electrodynamics.

An optional aperture 201 in layer 200 is shown so that layer 200 may behave as a flux focuser. In such a configuration, flux is focused through the aperture. Depending on the shape of the aperture and shield, flux may also be diverted around the sides of the material forming layer 200. There may be more than one aperture 201 within layer 200. Aperture 201 has a centroid $C_{201}$ positioned at distances $CW_{201}$ and $CL_{201}$, again with respect to $O_{200}$. Aperture 201 may be placed at an arbitrary location in layer 200. Aperture 201 can have any shape but has an average length $L_{201}$ and an average width $W_{201}$. The area of aperture 201 can range from about 1 μm² (1 μm²=$10^{-12}$ m²), for example, an area 1 μm by 1 μm, to about several hundred μm², depending on the embodiment.

Also shown is an optional device to avoid quantization of the flux in aperture 201. This device can be a slit or a "weak link", i.e., a feature in a superconducting material structure whose behavior exhibits Josephson-like relations. Among the properties of a weak link are that it permits the flux found in aperture 201 to escape. A slit has no current transport across it while a weak link can have current transport across it. When present, slit 202 in layer 200 is connecting between aperture 201 and an edge of layer 200, and has width $W_{202}$. Slit 202 may be parallel with either the length or width of layer 200 or may be aligned at some non-zero angle with respect to any edge of layer 200. When layer 200 comprises a superconductor, the device to avoid flux quantization, such as slit 202, is preferably present because having such a device allows for the magnitude of the flux to vary continuously and not be restricted to multiples of one flux quantum ("fluxon"). Further, absence of a slit or weak link and resulting quantification of the flux only allows for the magnitude of the flux to be greater than one fluxon. Embodiments of the invention include many possible slit widths $W_{202}$ including embodiments where the width of slit 202, $W_{202}$, is at least as wide as the thickness, $T_{200}$, of layer 200. Alternatively, slit 202 can be replaced by a region of thin material, preferably simply connected, that extends from aperture 201 to the edge of flux shield 200 but is thinner than the rest of layer 200. In particular, such a region is thinner than the magnetic penetration depth of the material. Such a region is known to one of skill in the art as an example of a weak link. For ease of manufacture, the thin material is the same as the rest of layer 200. Preferably layer 200, including the thin region is made of a single continuous piece of material. In general, the characteristics of the device that are required to avoid flux quantization may be provided by any structural modification with a critical current, in the plane of layer 200, that is about 90% or less than the critical current value for current flowing in the plane of layer 200. Alternatively, any device that obeys a Josephson relation will meet this requirement. This includes tunnel junctions such as those formed by thin insulating gaps. Accordingly, hereinafter, reference to slit 202 is taken to include reference to any modification such as a weak link that confers equivalent properties on the flux focuser as a slit.

Procedures to build layer 200 rely on well known methods of deposition and patterning. Examples of deposition are chemical vapor deposition and DC magnetron sputtering. Examples of patterning include lithographic techniques such as optical or electron beam lithography with the use of resist masks. The exact method used will depend on the embodiment of the invention in question. Alternative or additional patterning techniques may be required because the sizes of certain features, for instance aperture 201 may potentially be very small, e.g., submicron in dimensions. These extensions would comprise any method that has sufficient resolution to achieve a high level of coregistration (i.e., a high precision alignment) between structure 200 and other elements of 100 from FIG. 1A. A method to achieve such precision is direct electron beam writing with verification via microscopy.

The following procedure for patterning parts of an embodiment of the invention is given by way of illustration. It is to be understood that methods of manufacturing the quantum computing devices of the present invention are not to be limited to the procedures herein. A suitable device to form certain embodiments of layer 200, aperture 201 and slit 202 is a direct electron beam lithography machine such as the ZBA e-beam series from Leica Microsystems AG of Wetzlar, Germany. A beam energy of about 50 kV and a beam resolution of about 50 nm can be used to write the pattern. The pattern is written in electron beam resist, such as polymethylmethacrylate (PMMA), a layer that is placed above the layer of material to be patterned. The area surrounding layer 200 and the areas comprising aperture 201 and slit 202 are exposed to the e-beam during the writing process. The pattern is developed first by heating the sample on a hotplate before contacting with either chemical solution or to vapors, as is known to one of skill in the art. During developing, the exposed areas of resist are removed, leaving only layer 200 protected by the resist. Then etching is performed in an etching machine using a wet or dry etch. An exemplary etching machine is an Ar etching system produced by Sentech Instruments GmbH of Berlin, Germany.

An additional embodiment of the manufacture of structures appropriate for quantum computing includes the following methods as would be understood by one skilled in the art. Examples of the flux focuser 200, aperture 201 and slit 202 can be patterned using the variable shaped e-beam writer ZBA 23H by Leica Microsystems Lithography GmbH of Jena, Germany. The beam energy can be varied between 20 kV and 40 kV. Features as small as 200 nm can be created when a 2.5 nm grid is used. Resolution is dependent on the particular pattern. The resist masks are deposited on the material to be patterned and include "negative" resists. The resist may be heated. Some common examples require heating for as long as 3 minutes at temperatures up to about 90° C. Thereafter the area surrounding 201 and 202 and the areas comprising 200 would be exposed to the e-beam during the writing process. The pattern can be developed in a wet developer for 3 minutes. During development, the resist was removed leaving only the exposed areas. Then the etching is performed by a reactive ion etch process such as, carbon tetra-fluoride reactive ion etching ("CF$_4$-RIE") in a reactor manufactured by Material Research Corporation (MRC) of Orangeburg N.Y., U.S.A. The etching time depends on the chosen film thickness of the flux shield 200, T$_{200}$. In the example where the working gas for the dry etch is carbon tetra-fluoride and the flux shield is made from niobium, etching rates of approximately 20–30 nm/min. are typical.

In the foregoing examples of methods to pattern an embodiment of the present invention, verification of deposition and patterning may be required. This can be achieved for example by microscopy, e.g., optical or electron, and is useful for determining the accuracy of patterning and the coregistration of elements of an embodiment of the invention. For example, it allows for verification that no additional deposited material is placed that would obstruct aperture 201.

An embodiment of the present invention includes a substrate with appropriate circuitry to interact with a variety of systems. Referring to FIG. 1A, a substrate 70 can be prepared with material layers 80, 60, and 200. This collection of elements comprises a device that can be configured for various applications. Accordingly, this embodiment is prepared as an independent device which can include circuitry that is used to interact with, or control, a plurality of structures on a separate substrate. For example, an embodiment of the invention can be used to control and interact with a structure on a first separate substrate that includes a group of qubits, thereby performing quantum computing operations. Further, such an embodiment of the invention can be used to control and interact with a structure on a second separate substrate. This allows for the construction of initialization, control, coupling, and measurement circuitry independent of the quantum computing structure. Accordingly, the present invention provides a means to fabricate an initialization, control, coupling, or measurement circuit largely independent of the design and construction details of a particular qubit. This provides a hardware abstraction that increases the scope of application of many quantum computing structures.

In an embodiment of the present invention wherein the collection of layers 70, 80, and 200 can be prepared for use with another system, the patterning of elements can reflect the spatial distribution of a system or object the embodiment is to interact with. For instance, the form that layer 200 takes depends on the device that the embodiment is to interact with. An example would be layer 200 patterned with a large area and a single aperture. Such a device with the appropriate circuitry 80 could be incorporated into a sensitive magnetic probe. This would have a variety of applications beyond interacting with a superconducting structure. For example, it could interact with ferromagnetic structures. Where the measurement of several spatially separated devices is required, layer 200 can be patterned with multiple apertures. Alternatively, in the case where shielding is needed, several instances of layer 200 can be patterned to shield disjoint regions. These cases can be used in combination with one another if an application requires it. Thus, the specific arrangement of material 80, FIG. 1A, depends upon the application in question. A series of examples is shown in FIGS. 3A and 3B.

Figure 3A:
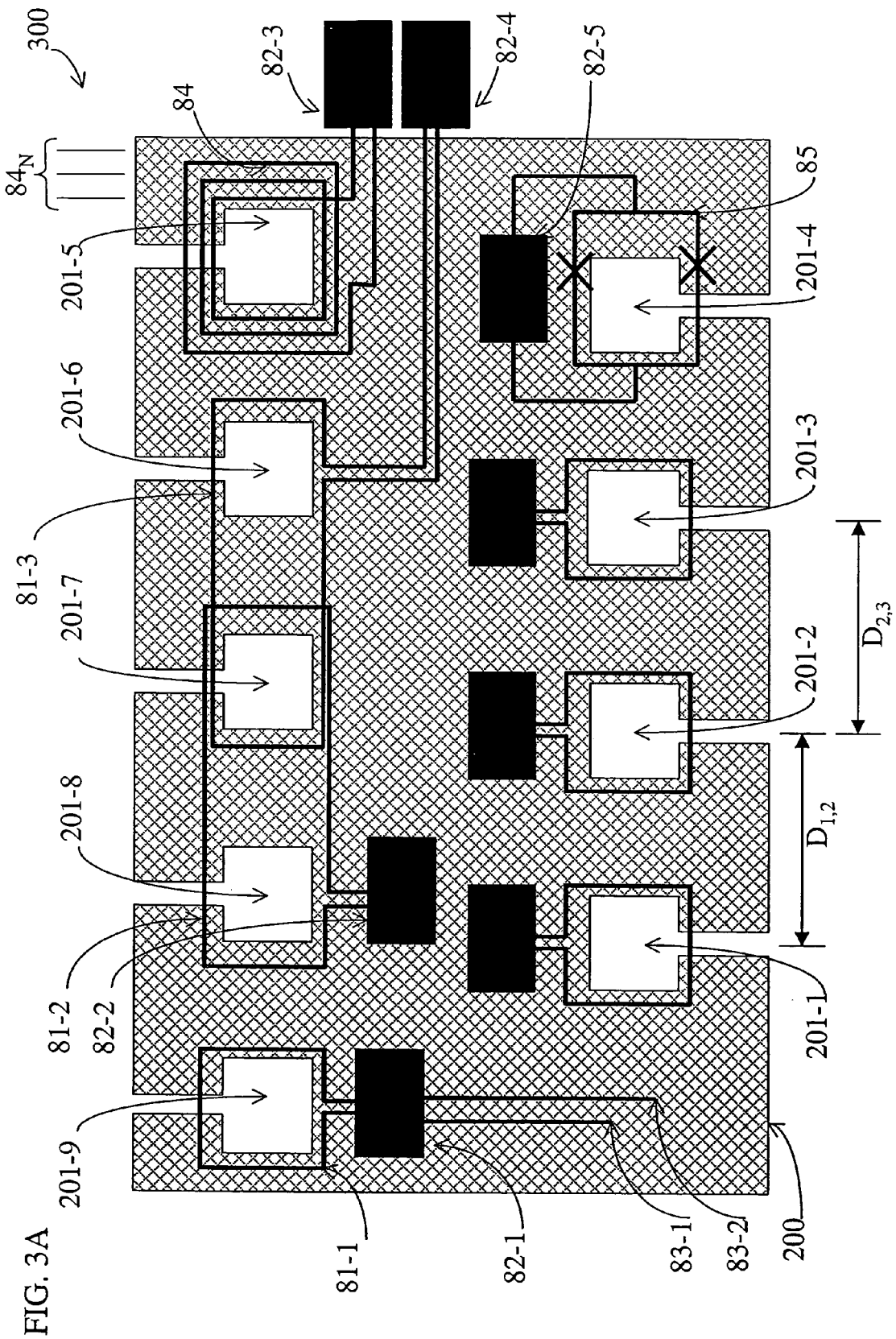
FIG. 3A shows an embodiment of a flux focuser with several apertures and FIG. 3B shows exemplary control, coupling and measurement circuitry.
Figure 3B:
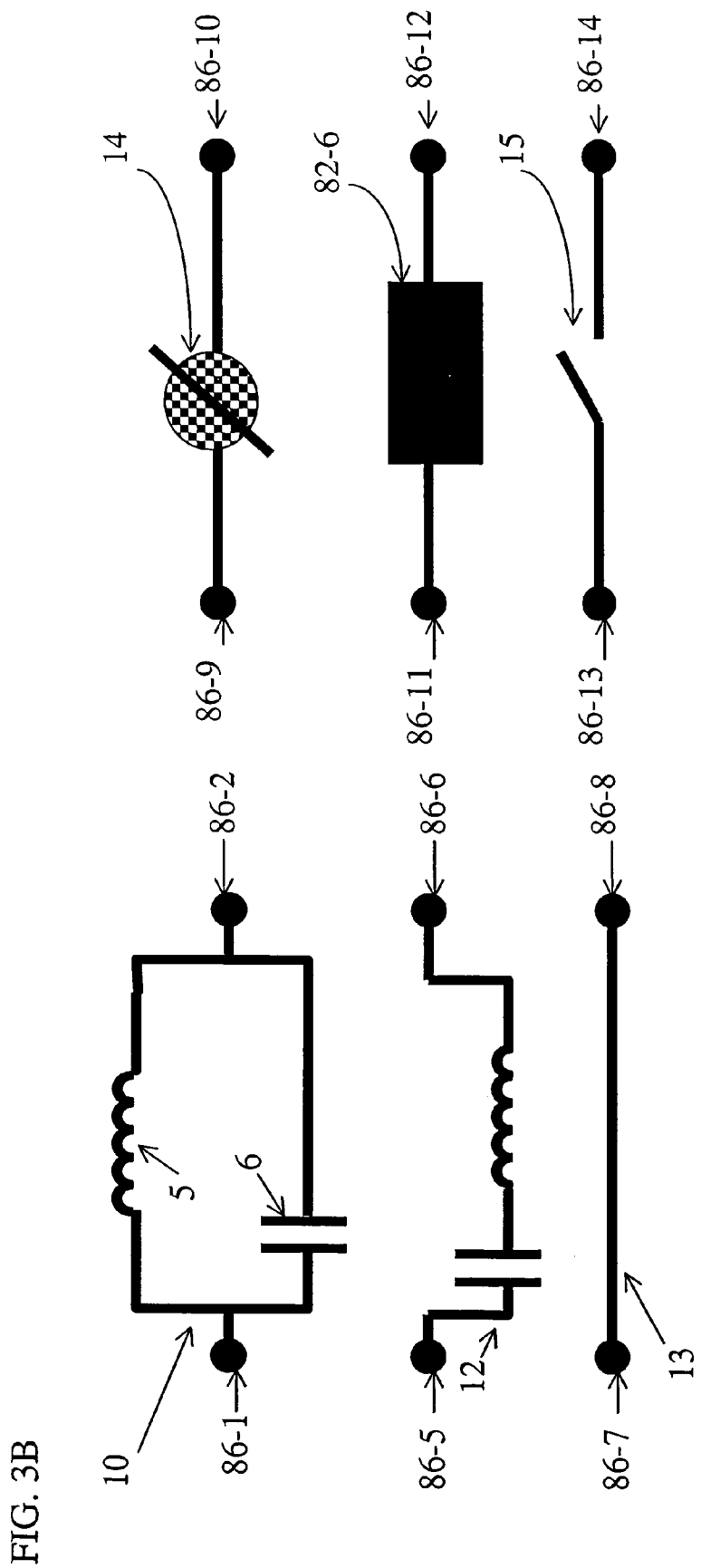

FIG. 3A depicts an embodiment 300 of the present invention that includes multiple apertures on a single flux shield 200. On layer 200 is the patterned material 80, represented by circuits 81. For example, circuits 81 may be initialization, control, coupling, and measurement circuitry for a qubit such as a phase or charge qubit. The utility of an embodiment such as 300 includes the ability to selectively couple with certain superconducting structures 50 (not shown).

In FIG. 3A, the apertures 201 are indexed counterclockwise from lower left of FIG. 3A as 201-1, 201-2, . . . and 201-9. Accordingly, shield 200 in FIG. 3A functions as many simultaneous flux focusers. Equally possible would be an embodiment with a series of flux shields with individual apertures, as might be required by a particular application of the present invention. Representative spacings between apertures 201 are labeled D$_{ij}$ where i and j are indices of respective apertures. The values of D$_{ij}$ are preferably determined by the inter-device spacing of the superconducting structures on the neighboring substrate. For instance, such a spacing is the qubit spacing of a quantum register, in the example where the superconducting structure is a quantum computing structure. These distances are not necessarily constant and typically vary according to detailed aspects of embodiment 300. Each of the apertures m FIG. 3A is preferably aligned directly above, or below, a qubit (not shown), thereby providing a means to couple each respective circuit 81 with a qubit through flux-focusing.

In the example of phase qubits, the embodiment of 80 for instance initialization, control, coupling and measurement circuitry is often inductively coupled. Therefore, aperture 201 is often enclosed by a loop of wire 81 connected to circuitry 82. FIG. 3A illustrates loops of wire 81, examples of which are labeled 81-1, and 81-2; elements of circuitry 82, labeled as 82-1–82-5; and lead wires 83, labeled as 83-1, and 83-2. A loop 81 may enclose a single aperture 201, as in 81-1, or many, as in 81-2. A single aperture 201 can correlate with a plurality of loops, for example when coupling two or more qubits. FIG. 3A illustrates that both 81-2 and 81-3 enclose aperture 201-7.

Circuitry 82 is preferably for the purpose of initialization, control, coupling and measurement of qubits. Circuitry 82 need not be positioned on layer 200 as in the case of 82-3 and 82-4. Optionally, 82 may have leads 83 that lead elsewhere, for example leads 83 can connect to elements that are not on the substrate. The configuration of circuitry 82 depends on how the embodiment of the present invention is used.

Circuitry 84 indicates the use of multiple loops of wire, such as in a "tank circuit" which is a type of resonance circuit. As depicted in FIG. 3A, circuit 84 relies on mutual inductance with a qubit positioned in alignment with aperture 201-5. Loops $84_N$, where N represents the number of loops in circuit 84, enable resonance circuit 84 to interact with circuitry on other substrates. Embodiments of the present invention can have the number of loops N equal to about 20. Additional embodiments can have N equal to values in the range of 1 through about 50. Varying N can be done in combination with varying the geometry of the flux shield 200 in FIG. 2, and the separations i.e., $d_{100}$, $d_{101}$, $d_{110}$, and $d_{120}$, in FIG. 1.

The operations of initialization, control, coupling and measurement of phase qubits are also described in U.S. Pat. No. 6,803,599, previously incorporated by reference. These methods can be applied to a phase qubit through inductive coupling. See for example U.S. patent application Ser. No. 60/349,663, entitled "Two Junction Phase Qubit," filed Jan. 15, 2002, previously incorporated by reference. As discussed in U.S. Pat. No. 6,803,599, the process of initializing a qubit places the qubit into a selected (e.g., known, desired) state. For instance, in U.S. Pat. No. 6,803,599, a qubit is initialized by grounding the qubit and applying a current across the qubit in a selected direction for a time sufficient for the quantum state of the qubit to relax into the selected state. As further discussed in U.S. Pat. No. 6,803,599, a qubit can be initialized, for example, to one of its basis states.

In the example of apertures 201-5 through 201-7, in FIG. 3A, circuitry 82 and loops 81 are examples of elements of coupling circuitry, for example, when the superconducting structure is a qubit. The type of coupling in such an embodiment can be inductive. An embodiment of the present invention can provide an inductive coupling between a DC-SQUID and a flux qubit, while achieving greater scalability and coherence than has previously been possible. The closed superconducting loop with two Josephson junctions 85, in FIG. 3A, represents a DC-SQUID. In FIG. 3A, the DC-SQUID will interact with the qubit aligned with aperture 2014. If multiple examples of 85 are present each DC-SQUID aligned with an aperture can interact with one superconducting structure, for example a qubit, without interacting with other superconducting structures, for example another qubit aligned with another aperture.

Elements of an embodiment of the present invention can be modular. For example, a flux qubit can be the same as in the experiments of Orlando et al., or can be any other flux qubit, and the interaction and control circuitry of the present invention can be a DC-SQUID or any other device useful for such a purpose. Further aspects of the present invention provide a means to localize interaction between the qubit, or qubit and associated circuitry, and the control circuitry, thereby permitting selectable interaction. This also increases scalability of the quantum elements as well as increases coherence for quantum computation. As is known to one skilled in the art, interaction with a qubit usually decoheres it. However, interaction with a specific qubit, as would be achieved with an inductive interaction with a flux qubit through a flux focuser, does not decohere other qubits if the other qubits are not coupled to the qubit in question. Therefore, in such circumstances, coherence is preserved for other qubits. Such behavior also promotes scalability.

Other possible embodiments of circuitry 82 are depicted in FIG. 3B. Embodiments include resonance circuits 10 or 12, or simple connections such as 13, 14 or 15. Leads 86, depicted as 86-1 to 86-14 represent connections to wires in circuitry 81 in FIG. 3A. Some embodiments may make use of a coherent switch 14 such as a Superconducting Single Electron Transistor (SSET). See, P. Joyez et al., "Observation of Parity-Induced Suppression of Josephson Tunneling in the Superconducting Single Electron Transistor", *Physical Review Letters*, 72(15):2458–2461, (1994), which describes operation and manufacture of single electron transistors and is incorporated by reference herein in its entirety. These devices include mesoscopic grains that are sensitive to the presence or absence of a single charged particle. A coherent switch 14 can be incorporated into other examples of circuitry 82. Still other embodiments of circuitry 82 may make use of a simple switch 15. Circuitry 82-6 indicates an additional level of abstraction in which circuitry can itself connect to other instances of the same types of circuitry. For example, 82-6 may represent a circuit such as 10 with the addition of active circuit elements such as amplifiers in place of inductor 5. The circuitry of a 82-6 may include a complicated network of elements like resonance circuit 10, at least some of which are selectable by a switch or other mechanism.

A useful circuit for initialization, control, coupling and measurement is a resonance circuit. If such a circuit is coupled to the superconducting structure and the resonance response has a dependence on the state of the superconducting structure, for example the quantum state, then changes in the state of the superconducting structure cause small changes in the resonance circuit that are amplified by the resonance effect. An example of a resonance circuit, or tank circuit, which is an embodiment of the circuitry 8Q is found in the disclosure of U.S. patent application Ser. No. 60/341,794, entitled "Characterization and Measurement of Superconducting Structures," filed Dec. 18, 2001, which is incorporated herein by reference. A resonance circuit 10 is shown in FIG. 3B and includes an inductor 5 and a capacitor 6. The circuit is connected to leads 86-1 and 86-2. Resonance circuit 10 is inductively coupled to a superconducting structure 50 in FIG. 1A. Resonance circuit 10 can be designed from superconducting material or normal conductors, and can be a free standing circuit or an integrated circuit on substrate 70, as illustrated in FIG. 1B. The leads are often connected in a node with loop 81, and circuits 82. They lead off chip to where the signal is amplified and later processed. They are the leads by which currents enter and leave circuitry 80, or across which a voltage can be measured. For example, a current can be fed into circuits 82 when it is a resonance circuit and the effect of the qubit on the resonance circuit is monitored as voltage across leads 83-1 and 83-2.

Resonance circuit 10 may be constructed to minimize the resistance of the circuit and tune the resonance of the circuit's frequency, $\omega_o$, and quality factor, Q. The quality factor Q is defined as the ratio of the resonance frequency to the spectral width (full width half maximum height) of a resonance response curve. A desirable quality factor may be any value over about 1,000. Again, the possible construction methods of this embodiment of circuitry 80 are varied. Inductor 5 may be, in one embodiment, a small wire winding of about 4 mm across. The wire may be a ductile high quality conductor such as copper (Cu), silver (Ag), gold (Au) or a superconductor such as aluminum (Al) or niobium (Nb).

When including resonance circuit 10 in an integrated circuit that is designed to operate at sub liquid helium temperatures (i.e., <~4K), inductor 5, capacitor 6, and leads 81 can be constructed from low temperature superconductors such as Nb or Al. The inductor 5 can be about 15–25 turns of a 300 nm thick niobium layer that is approximately 0.5 µm to 2.0 µm wide (1 µm=$10^{-6}$ meters). Capacitor 6 can comprise parallel plates approximately 0.25 mm² (1 mm²=$10^{-6}$ m²) in area. Alternatively, capacitor 6 can be a surface mounted capacitor soldered on to substrate 70, shown in FIG. 1, after the rest of resonance circuit 10 has been constructed.

Embodiments of the present invention include examples where components of resonance circuit 10 have the following physical properties. The inductor 5 can have an inductance of about 60 to 100 nH (nH=$10^{-9}$ Henry). The capacitor 6 can have capacitance of about 100–400 pF (pF=$10^{-12}$ Farad). Embodiments of the present invention include the use of such inductors and capacitors to achieve a quality factor Q of about 2000 at 20 mK (1 mK=$10^{-3}$ Kelvin) and about 500 at 4.2 K (1K=1 Kelvin).

The resonance circuit 10 of FIG. 3B can be fabricated on a substrate 70 of, for example, silicon. Layers of niobium (Nb), aluminum oxide ($AlO_x$) and silicon oxide ($SiO_x$) may be deposited by, for example, DC-magnetron and evaporation, and etched using, for example, carbon tetra-fluoride reactive ion etching ("$CF_4$-RIE") or any other suitable deposition and etching techniques. Structures can be patterned using well known techniques such as optical or electron beam lithography. (See the description found at the first three paragraphs of section 2 of R. Stolz et al., *Supercond. Sci. Technol.* 12:806 (1999) which is incorporated by reference in its entirety.) In one embodiment, the windings of inductor 5 can be constructed out of niobium. In a preferred embodiment, the wiring layers may be separated from each other by as much as about 800 nm thick layers of SiO to eliminate stray or parasitic capacitance.

Alternatives to inductor 10 are variations on the resonance circuit. One such example is circuit 12 where the circuit elements are in series. This has application in, but not limited to, coupling qubits. The resonance circuit could have its components in parallel. The examples of circuits 10 and 12 can have an optional switch to open the circuit and decouple it. For instance, if circuit 10 were used for initializing a qubit, after the initialization has completed, circuit 10 should be decoupled from the qubit. Given that the possible types of material 50 are varied, the forms of circuitry 82 are optionally left abstracted.

Figure 4A:
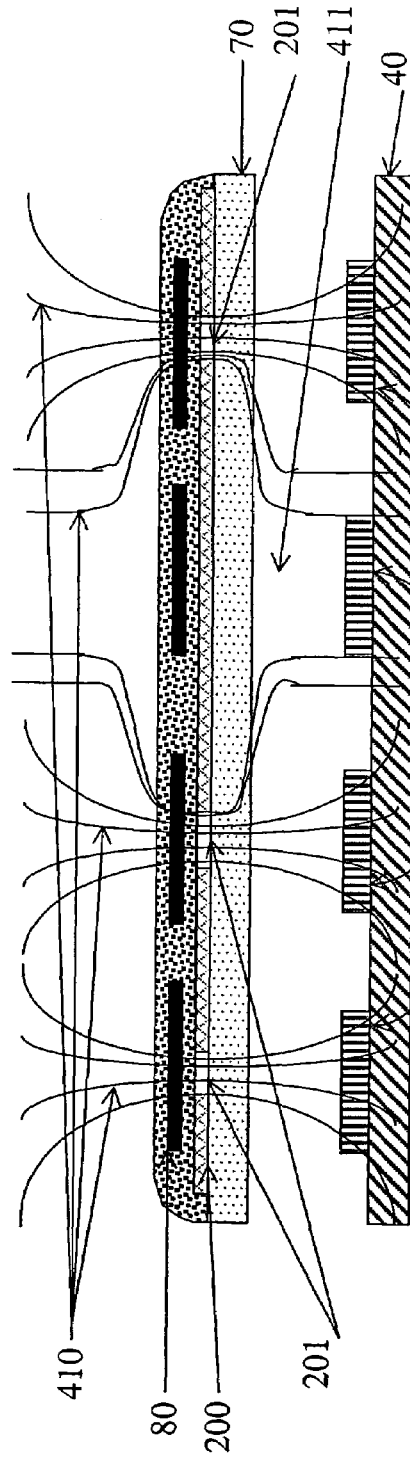
FIG. 4A shows an example of inductive coupling between circuitry and an array of superconducting structures according to the present invention, in cross-sectional view.
Figure 4B:
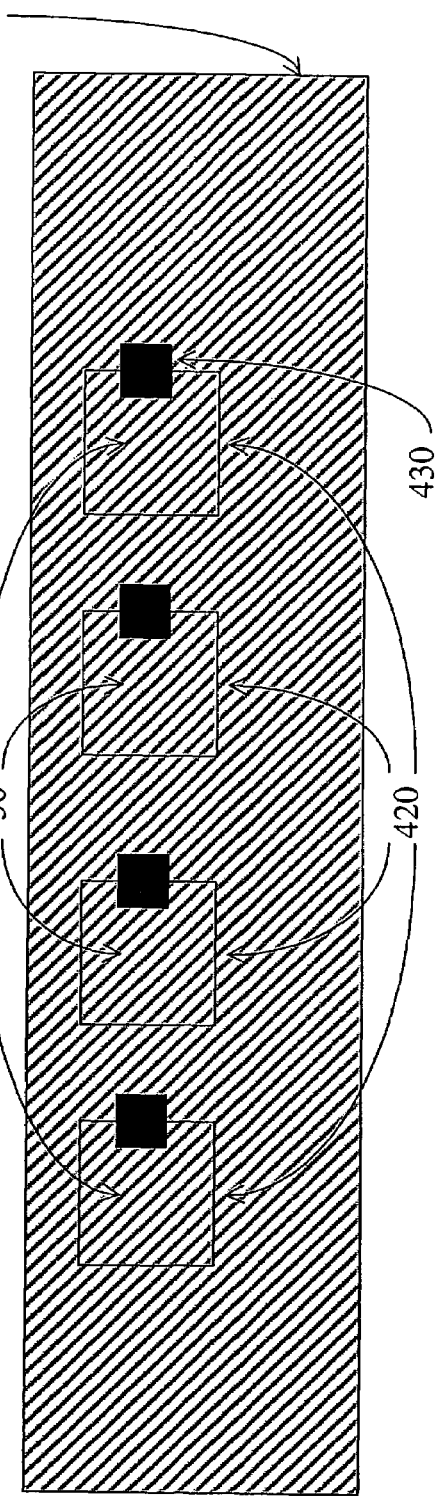
FIG. 4B shows a plan view of the apparatus of FIG. 4A.

FIGS. 4A and 4B illustrate an embodiment 400 of the present invention in which the inductive coupling of circuits 80 to instances of material 50 is shown. One aspect of this coupling may be to characterize the properties of material 50 where it is some superconducting structure. Some useful properties could be the energy dependence of the superconducting structure with respect to the variation of some parameter, such as phase or applied flux. If the superconducting structure 50 has a well defined set of states, circuits 80 could be used to determine which state structure 50 occupied. Inductive coupling is a method for doing this. Flux, represented schematically by lines 410, can be generated by circuitry 80 to affect structure 50. In the embodiment where circuitry 80 and material 50 are objects of a quantum mechanical nature, for example certain superconducting circuits such as a qubit, it is said that circuitry 80 and structure 50 can be "entangled." The lines of flux 410 can penetrate flux shield 200 via an aperture such as 201 or be blocked by flux shield 200 and therefore be established near the individual elements that make up layer 50. In this way, elements of layer 50 on the substrate 40 are selectively entangled with elements of circuitry 80. This entanglement can be one to one if the inter element spacing of 50 exceeds the characteristic decay length of the flux by about an order of magnitude or more. For example, regions 411 are free of flux 410 and a sample of structure 50 could be placed there and be isolated.

Relevant details of the embodiment 400 are depicted in FIG. 4B. In order to inductively interact with the superconducting structure 50, the structure can have at least one loop 420 with an inductance L. The remainder of structure 50 is abstracted into an object denoted 430, an example of which could be a network of Josephson junctions. Loop 420 is coupled inductively to circuit 80 of FIG. 4A which has inductance $L_T$. The effective inductance of superconducting structure 50 can depend on the state of the superconducting structure 50. When the superconducting structure 50 with a current-carrying loop 420 is inductively coupled to a circuitry 80, such as resonance circuit 10 in FIG. 3B, changes of the effective inductance L of superconducting structure 50 are detectable by the circuitry 80. For example, this detection can include a change in the impedance of a resonance circuit. Further, the reverse case holds, changes in the state of circuitry 80 can effect the state of the superconducting structure 50. See Il'ichev et al., "Radio-frequency Based Monitoring of Small Supercurrents," *Review of Scientific Instruments* 72(3): 1882–1887, (2001), incorporated herein by reference. Therefore, by amplification or digitization, it is possible to detect the change in effective impedance of circuit 80 as it manifests itself as a change in voltage or current of circuit 80.

Here the utility of flux focuser 200 having an aperture 201 is apparent. Regions of a substrate 40 or a substrate 41 can be placed in regions without flux 411, while other regions 410 are exposed to flux. This exposure to the flux is focused, allowing circuit 80 and structure 50 to be separated while interaction is retained. Alternatively, circuit 80 or structure 50 could affect the other but not vice versa. Regardless, flux focuser 200 and aperture 201 can facilitate some interactions of circuit 80 and structure 50, thereby satisfying an aspect of the invention. This is to be contrasted with the normal circumstance without the flux focuser, in which the flux 410 can severely decohere a superconducting structure. In an embodiment where the superconducting structure is a qubit, this decoherence would make quantum computation impractical. Where the superconducting structure is a quantum register and no flux focuser is used, the flux may cause decoherence in other qubits. Hence, the flux focuser provides scalability to qubit designs.

Embodiments of the present invention include any type of qubit as the superconducting structure 50. Examples of these are Josephson junction qubits. See Y. Makhlin, G. Schon, and A. Shnirman, "Quantum-State Engineering with Josephson-Junction Devices," Reviews of Modern Physics 73:357 (2001) for an overview, and U.S. patent application Ser. No. 09/452,749 entitled "Permanent Readout Superconducting Qubit"; and U.S. Pat. No. 6,614,047; and U.S. patent application Ser. No. 60/349,663, entitled "Two Junction Phase Qubit," filed Jan. 15, 2002, each of which is incorporated herein by reference.

The form of the alignment between elements to be coupled depends on the type of structure 50 and circuit 80 used, as well as the particular application of the present invention. At the very minimum, the alignment need only be done once before either structure 50 or circuit 80 are operating. For instance, two substrates can be mechanically aligned prior to their incorporation in a larger device. Such an alignment could be carried out at room temperature on a microscope stage, optionally with the use of a bright light source or piezoelectric actuators, followed by fixing the items in place with adhesive.

Figure 4C:
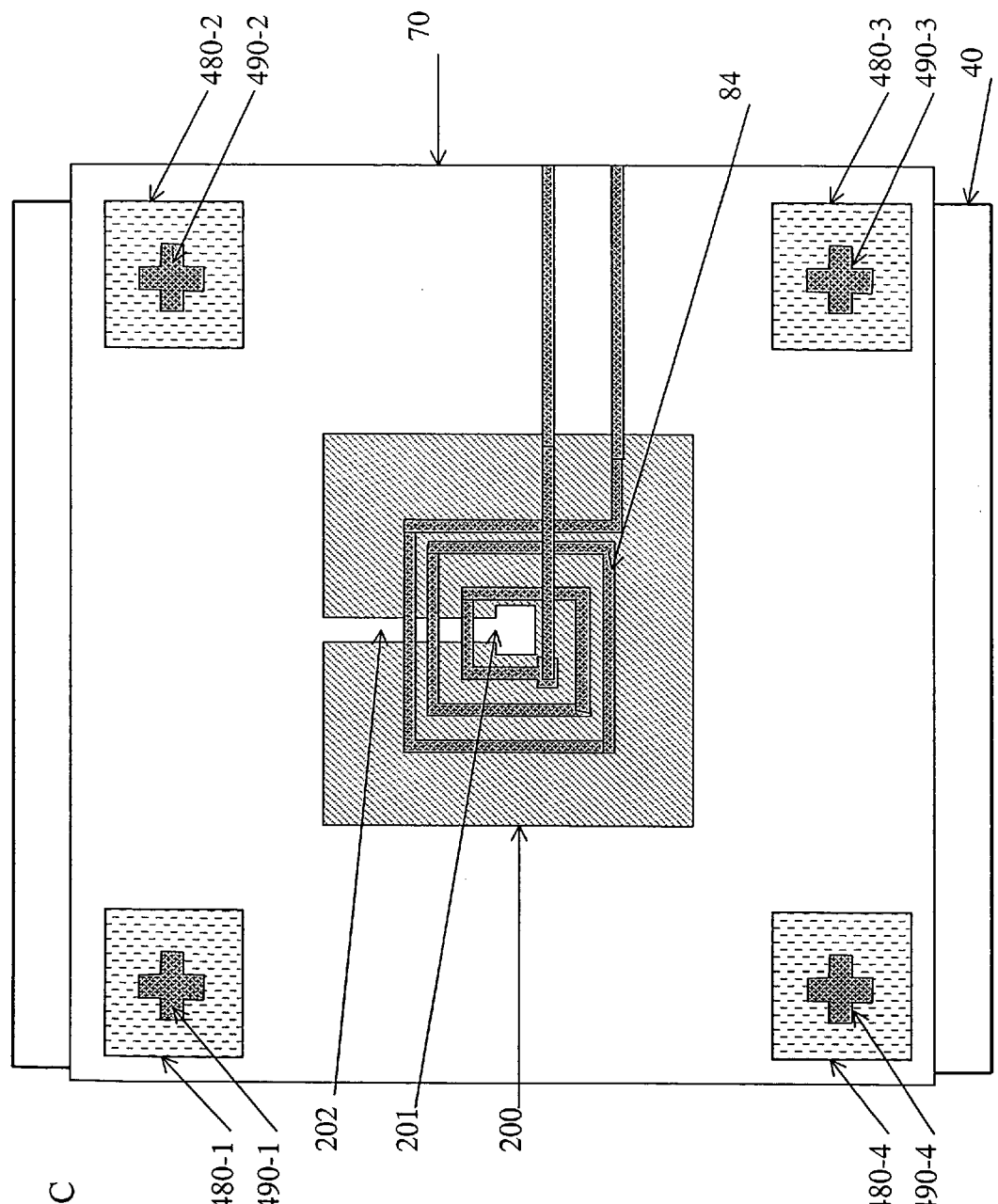
FIG. 4C illustrates a plan view in which the alignment between circuitry and superconducting structures is determined.

FIG. 4C illustrates an example of the alignment of circuitry on a first substrate 70 with a superconducting structure on a second substrate shown positioned underneath it. An aspect of the present invention relates to the ability to align substrate 70 with circuitry and, depending on the embodiment, a layer 200, over the superconducting structure on the substrate beneath. A variety of alignment methods are possible. Where one can view and manipulate at least one substrate and incorporate information about the location and orientation of the other substrate, alignment can be performed. An example, used by way of illustration and not limitation is, when substrate 70 is transparent it is possible to align the components of 84 over a particular set of components on the other substrate such as a superconducting structure. Examples of transparent substrates are those made from sapphire, strontium titanate, or substrates that exhibit anomalous dispersion such as those made from silicon, with sufficiently polished surfaces. These are commercially available and have been used in semiconductor and superconductor manufacturing and research.

Consider an example depicted in FIG. 4C wherein in an instance of each of layer 200, with aperture 201 and slit 202 and circuitry 80, in the embodiment of coil 84 is employed to couple to a superconducting structure. In FIG. 4C, 490-1, 490-2, 490-3 and 4904 are reference points on substrate 70, and 480-1, 480-2, 480-3 and 480-4 are reference points on substrate 40. In the example, the substrate 70 is placed over a second substrate (such as substrate 40 in FIG. 1). Both substrates are backlit and the reference points 480 and 490 are used to align the aperture 201 over the superconducting structure. The reference points are patterned materials on both substrates. It is the shadow of 480 that is aligned with reference point 490 that indicates whether the superconducting structure and 201 are aligned. This is done because the superconducting structure is often small, as is the case with superconducting qubits, and does not cast a discernible shadow. Because the two substrates have more than one degree of freedom, multiple reference points are provided. In the example where the superconducting structure is a flux qubit, the alignment of aperture 201 with loop 420 (see FIG. 4B) inductively couples the superconducting structure and coil 84. Here, coil 84 could be coupled to an exemplary measurement circuitry based on a resonance circuit. The alignment would preferably have the aperture 201 over the current carrying loop 420 of the qubit, thereby coupling circuitry 80 to a particular qubit even though the substrate below may have more than one qubit, (as shown in FIG. 4A).

Figure 5A:
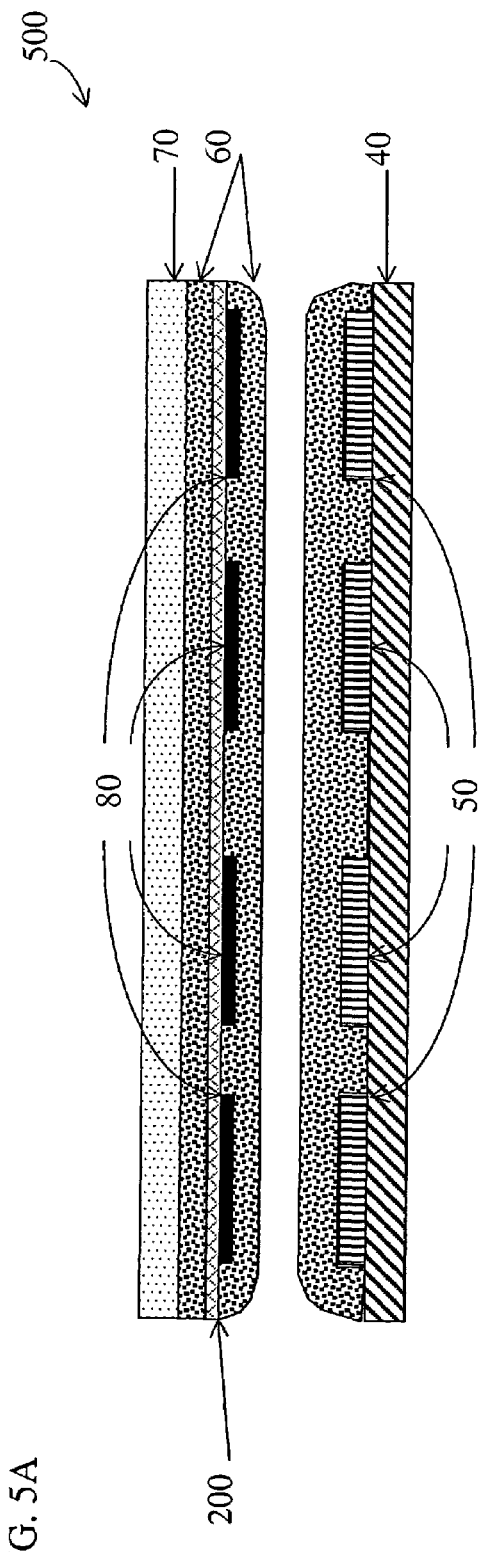
FIG. 5A shows a cross sectional view and FIG. 5B shows a schematic plan view of an exemplary use of a flux shield between initialization, coupling and control circuitry.
Figure 5B:
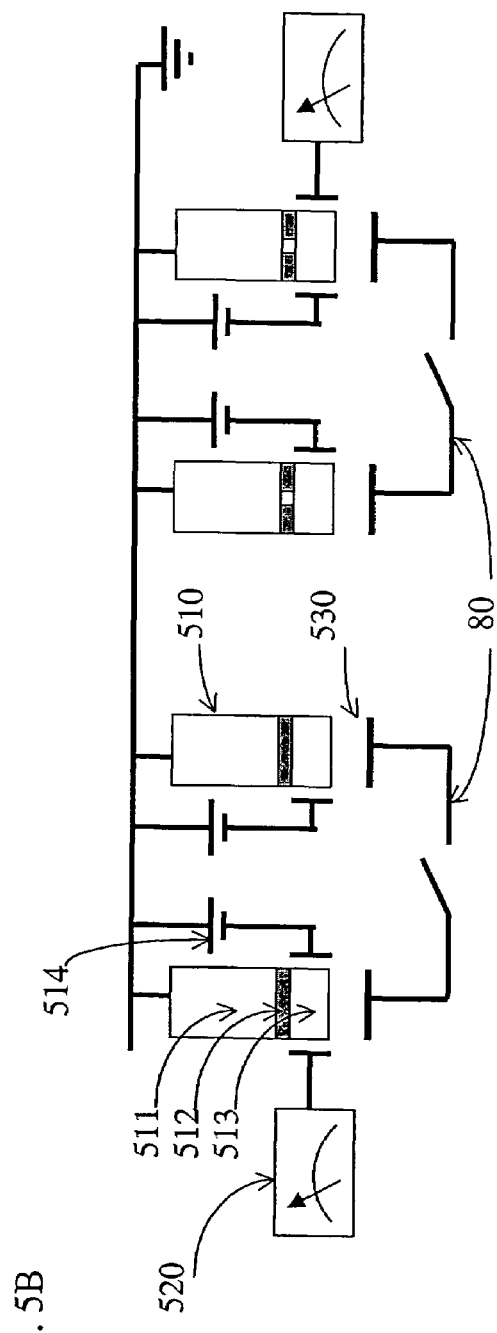

FIGS. 5A and 5B illustrate an embodiment of the invention in which the coupling is different from the example of inductive coupling. For example, when dealing with quantum systems, different couplings can create different Hamiltonians. Furthermore, couplings have other qualities such as switchability or robustness. An example of an alternative coupling is capacitive coupling, as shown in FIG. 5, for a charge qubit. Since circuitry 80 and structure 50 lie in close proximity, capacitive coupling is possible. Portions of circuitry 80 on substrate 70 are electrodes placed near portions of the superconducting structure 50 on substrate 40. Optionally found on substrate 70 is an example of the layer 200 behaving as a flux shield to provide protection from the electromagnetic environment. Additional flux shields can be used to do this. Note the insulating layers 60 that separate flux shield 200 from circuitry 80 so as to eliminate capacitance between circuitry 80 and flux shield 200.

Capacitive coupling is a further embodiment of the present invention. In the case where structure 50 is a charge qubit, i.e., a quantum computing structure whereby the bit states correspond to the presence or absence of a charged particle, capacitive coupling has been proposed as a means of measurement. See A. Shnirman, and G. Schön, "Quantum measurements performed with a single-electron transistor", Phys. Rev. B, 57(24):15400–15407 (1998), which is incorporated herein by reference. Capacitive coupling is illustrated in FIG. 5B, where there is an example of qubits 510 that have a charge reservoir 511, a dirty Josephson junction 512, and an island 513. As is known to one of skill in the art, a dirty Josephson junction is one in which Cooper pairs scatter so that the coherence length is altered. The island 513 is capacitively coupled to a bias system 514. Also via capacitive coupling is a measurement system 520 and a coupling system 530. Measurement system 520 may be a sensitive detector comprising one or more Josephson junctions or may also be a single electron transistor (SET). Although a qubit per se does not require a measurement system, when used in a computing machine, at least one measurement system must be connected, directly or indirectly, to the qubit. Bias system 514, measurement system 520 and coupling system 530 need not be on the same substrate as qubit 510 and could be on the substrate 70 as part of circuitry 80.

While not limited to the embodiment of the invention in FIGS. 5A and 5B, it is possible to have a one to many ratio between a control system 80 on one substrate 70 and superconducting structures 50 on a plurality of other substrates 40. For all given embodiments there can be a plurality of superconducting structures 50 on separate substrates while using another substrate 70 on which circuitry 80 is placed.

Figure 6:
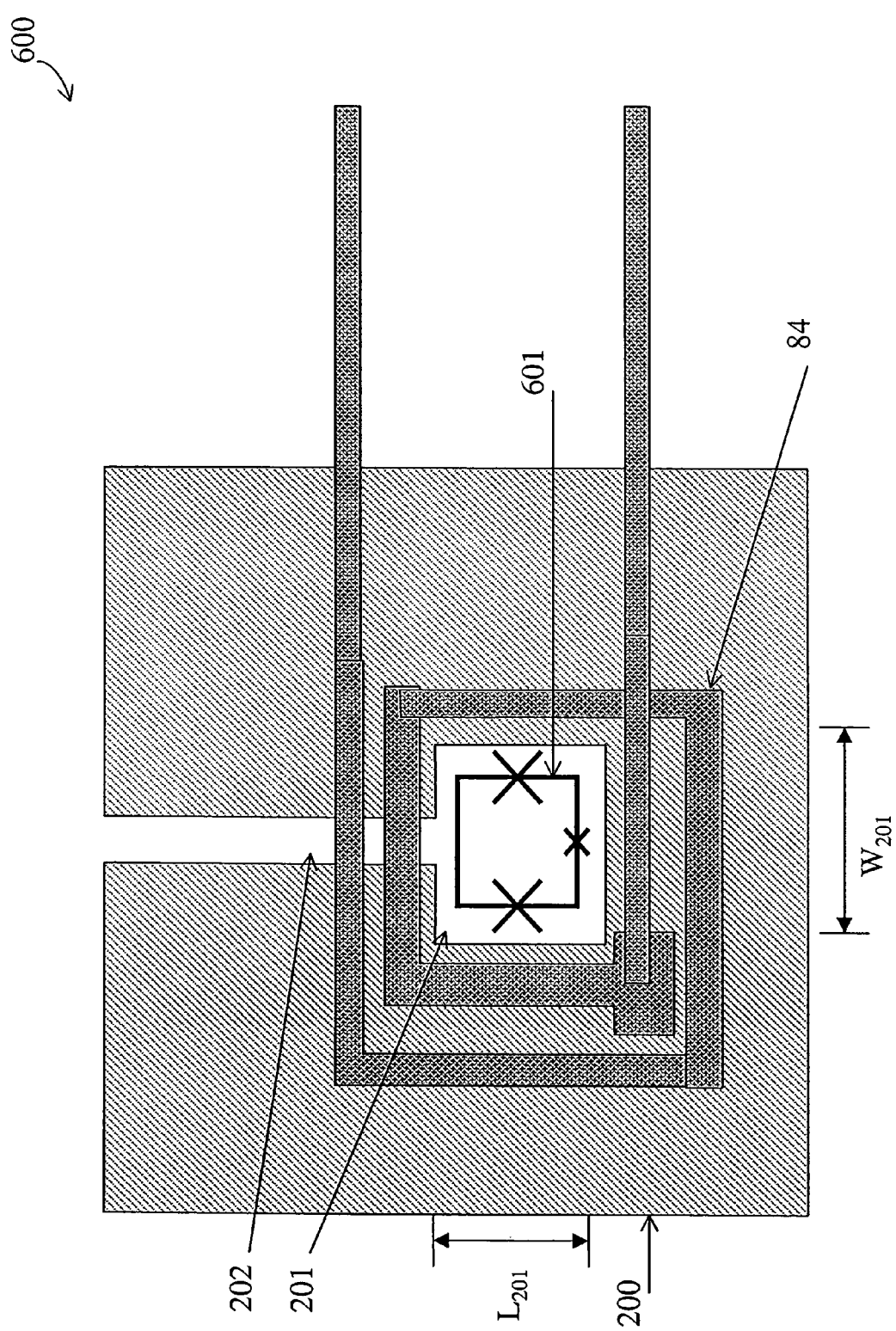
FIG. 6 shows an embodiment of the present invention in which a superconducting structure and an element of circuitry reside on a single substrate.

FIG. 6 illustrates an embodiment of the present invention wherein the superconducting structure 601 is deposited and patterned on the same substrate (not shown in FIG. 6) as circuitry 84 and flux shield 200. This can be done where the aperture 201 in flux shield 200 has an area with sufficient size for a superconducting structure to be patterned inside of the aperture. Embodiments of the invention include an aperture with an area of about 10 $\mu m^2$ e.g., 10 $\mu m$ by 10 $\mu m$ or larger. For instance, in one embodiment of the invention, the aperture 201 can be 20 $\mu m$ by 20 $\mu m$. In FIG. 6, aperture 201 has mean width W201 and a length L201. The flux focusing effect of 200 with aperture 201 can be used to couple an example of the circuitry 84 to an example of a superconducting structure 601. Here the superconducting structure is a persistent current qubit 601, which comprises a superconducting material loop having three Josephson junctions, one of slightly smaller Josephson energy or critical current than the other two. In FIG. 6, a Josephson junction on structure 601 is indicated by an "X". The larger the "X" in FIG. 6, the larger is the Josephson energy. An example of such a superconducting structure can be found in J. E. Mooij, T. P. Orlando, L. Levitov, L. Tian, C. H. van der Wal, and S. Lloyd, "Josephson persistent-current qubit", Science 285:1036 (1999), incorporated by reference.

All references cited herein are incorporated herein by reference in their entirety and for all purposes to the same extent as if each individual publication or patent or patent application was specifically and individually indicated to be incorporated by reference in its entirety for all purposes.

Although the invention has been described with reference to particular embodiments, the description is only examples of the invention's applications and should not be taken as limiting. Various adaptations and combinations of features of the embodiments disclosed are within the scope of the invention as defined by the following claims.

What is claimed is:

1. A method comprising:
    initializing a first superconducting structure on a first substrate to a first known quantum state by adjusting a current in a first element of circuitry on a second substrate, wherein the first element of circuitry and the first superconducting structure are inductively coupled through a first aperture in a first flux shield;
    allowing the quantum state of the first superconducting structure to evolve from the first known quantum state; and
    measuring the quantum state of the first superconducting structure by measuring a state of the first element of circuitry.

2. The method of claim 1 further comprising:
    controlling the quantum state of the first superconducting structure by manipulating the current in the first element of circuitry.

3. The method of claim 1 further comprising, after completion of the initializing:
    decoupling the first superconducting structure from the first element of circuitry by manipulating the current in the first element of circuitry.

4. The method of claim 1 further comprising:
    initializing a second superconducting structure on the first substrate to a second known quantum state by adjusting the current in the first element of circuitry, wherein the first element of circuitry and the second superconducting structure are inductively coupled through a second aperture in the first flux shield;
    allowing the quantum state of the second superconducting structure to evolve from the second known quantum state; and
    measuring the quantum state of the second superconducting structure by measuring the state of the first element of circuitry.

5. The method of claim 1 further comprising:
    initializing a second superconducting structure on the first substrate to a second known quantum state by adjusting a current in a second element of circuitry on the second substrate, wherein the second element of circuitry and the second superconducting structure are inductively coupled through a second aperture in a second flux shield;
    allowing the quantum state of the second superconducting structure to evolve from the second known quantum state; and
    measuring the quantum state of the second superconducting structure by measuring a state of the second element of circuitry.

6. The method of claim 1 wherein the first element of circuitry is a resonance circuit with a first lead and a second lead, and wherein said state of the first element of circuitry is a voltage across the first lead and the second lead.

7. A method for operating a quantum computing apparatus comprising:
    coupling a first superconducting qubit and a second superconducting qubit by activating a current in a coupling circuit: wherein
    a flux shield enhances a first inductive coupling between the first superconducting qubit and the coupling circuit or the flux shield enhances a second inductive coupling between the second superconducting qubit and coupling circuit.

8. The method of claim 7 wherein the coupling comprises:
    entangling the coupling circuit with the first superconducting qubit;
    decoupling the coupling circuit from the first superconducting qubit; and
    entangling the coupling circuit with the second superconducting qubit.

9. The method of claim 5 wherein the second element of circuitry is a resonance circuit with a first lead and a second lead, and wherein said state of the first element of circuitry is a voltage across the first lead and the second lead.

10. The method of claim 1 wherein said first superconducting structure is a qubit and said known quantum state is a basis state of said qubit.

* * * * *